(12) United States Patent
Park et al.

(10) Patent No.: US 9,929,225 B2
(45) Date of Patent: Mar. 27, 2018

(54) DISPLAY DEVICE AND A MANUFACTURING METHOD THEREOF

(71) Applicant: SAMSUNG DISPLAY CO., LTD., Yongin-si, Gyeonggi-do (KR)

(72) Inventors: Won Mo Park, Seongnam-si (KR); Young Su Kim, Hwaseong-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/139,907

(22) Filed: Apr. 27, 2016

(65) Prior Publication Data
US 2017/0141175 A1    May 18, 2017

(30) Foreign Application Priority Data
Nov. 16, 2015   (KR) .................. 10-2015-0160501

(51) Int. Cl.
*H01L 29/08*    (2006.01)
*H01L 27/14*    (2006.01)
(Continued)

(52) U.S. Cl.
CPC ...... *H01L 27/3276* (2013.01); *H01L 27/3248* (2013.01); *H01L 27/3262* (2013.01); *H01L 27/3265* (2013.01); *H01L 2227/323* (2013.01)

(58) Field of Classification Search
CPC ............. H01L 27/3276; H01L 27/3248; H01L 27/3262; H01L 27/3265; H01L 2227/323
(Continued)

(56) References Cited

U.S. PATENT DOCUMENTS

| 2002/0158835 A1* | 10/2002 | Kobayashi | .......... H01L 27/3244 345/100 |
| 2010/0045173 A1* | 2/2010 | Kwon | ................. H01L 27/3246 313/504 |

(Continued)

FOREIGN PATENT DOCUMENTS

| JP | 64-035960 | 2/1989 |
| KR | 100038351 | 12/1990 |

(Continued)

OTHER PUBLICATIONS

English Machine Translation Korean Patent Application No. KR19870011757.*

*Primary Examiner* — Dzung Tran
(74) *Attorney, Agent, or Firm* — F. Chau & Associates, LLC

(57) ABSTRACT

A display device includes a substrate, first through fourth metal wires, first and second insulating layers, and a compensation pattern. The first metal wire is positioned on the substrate and extends in a first direction. The first insulating layer is positioned on the first metal wire and the substrate. The second metal wire is positioned on the first insulating layer, extends in the first direction, and is adjacent to the first metal wire. The second insulating layer is positioned on the first insulating layer and the second metal wire. The compensation pattern is positioned on the second insulating layer and is disposed between the first metal wire and the second metal wire. The third metal wire and the fourth metal wire are positioned on the second insulating layer and extend in a second direction that is different from the first direction.

16 Claims, 15 Drawing Sheets

(51) Int. Cl.
*H01L 23/48* (2006.01)
*H01L 27/32* (2006.01)

(58) Field of Classification Search
USPC .......................................... 257/40, 431, 768
See application file for complete search history.

(56) References Cited

U.S. PATENT DOCUMENTS

| | | | | |
|---|---|---|---|---|
| 2010/0072882 | A1* | 3/2010 | Hwang | ............... H01L 51/5265 |
| | | | | 313/504 |
| 2012/0001191 | A1* | 1/2012 | Ma | ................... G02F 1/136213 |
| | | | | 257/71 |
| 2014/0299843 | A1* | 10/2014 | Kim | ................... H01L 27/3265 |
| | | | | 257/40 |
| 2014/0346478 | A1* | 11/2014 | Cho | ................... H01L 27/1255 |
| | | | | 257/40 |
| 2016/0104757 | A1* | 4/2016 | Kim | ................... H01L 27/3276 |
| | | | | 257/40 |

FOREIGN PATENT DOCUMENTS

| | | |
|---|---|---|
| KR | 100639030 | 10/2006 |
| KR | 1020140045839 | 4/2014 |

\* cited by examiner

DISPLAY DEVICE AND A MANUFACTURING METHOD THEREOF

CROSS-REFERENCE TO RELATED APPLICATION

This application claims priority under 35 U.S.C. § 119 to the Korean Patent Application No. 10-2015-0160501 filed in the Korean Intellectual Property Office on Nov. 16, 2015, the disclosure of which is incorporated by reference herein in its entirety.

TECHNICAL FIELD

Exemplary embodiments of the present invention relate generally to a display device and a manufacturing method thereof.

DISCUSSION OF RELATED ART

In general, a display device includes a plurality of pixels as units displaying an image, and a plurality of drivers transmitting signals to drive the plurality of pixels. The drivers include a data driver applying a data voltage to a pixel, and a scan driver applying a gate signal. The scan driver and the data driver can be mounted to a printed circuit board (PCB) as a chip and are connected to the display panel, or are directly mounted to the display panel. However a scan driver that does not require high mobility of the thin film transistor channel may use a structure in which the scan driver is not formed as an additional chip but is instead integrated with the display panel.

Scan drivers integrated in the display panel include a plurality of wires. These wires may be formed in the same layer as a wire included in a thin film transistor in a pixel. The wires of the drivers may be adjacent to each other, and an upper surface of an insulating layer may not be flat. Accordingly, a groove may form between the adjacent wires.

SUMMARY

According to an exemplary embodiment of the inventive concept a display device includes a substrate, a first metal wire, a first insulating layer, a second metal wire, a second insulating layer, a compensation pattern, and a third metal wire and a fourth metal wire. The first metal wire is positioned on the substrate and extends in a first direction. The first insulating layer is positioned on the first metal wire and the substrate. The second metal wire is positioned on the first insulating layer and extends in the first direction. The second insulating layer is positioned on the first insulating layer, the second metal wire, and adjacent to the first metal wire. The compensation pattern is positioned on the second insulating layer and disposed between the first metal wire and the second metal wire. The third metal wire and a fourth metal wire is positioned on the second insulating layer and extending in a second direction that is different from the first direction.

In an exemplary embodiment of the inventive concept, the first insulating layer and the second insulating layer may be made of an inorganic insulating material.

In an exemplary embodiment of the inventive concept, a groove may be disposed in the second insulating layer and positioned between the first metal wire and the second metal wire may be further included, and the compensation pattern may be positioned in the groove.

In an exemplary embodiment of the inventive concept, the compensation pattern may extend in the first direction.

In an exemplary embodiment of the inventive concept, the compensation pattern may be made of a material having a different etching rate from that of the second insulating layer.

In an exemplary embodiment of the inventive concept, the compensation pattern may be made of a metal.

In an exemplary embodiment of the inventive concept, the compensation pattern may be made of the same material as the third metal wire and the fourth metal wire.

In an exemplary embodiment of the inventive concept, a thickness of the compensation pattern may be thinner than the thickness of the third metal wire and the fourth metal wire.

In an exemplary embodiment of the inventive concept, a third insulating layer positioned on the second insulating layer and the compensation pattern may be further included, and the third metal wire and the fourth metal wire may be positioned on the third insulating layer.

In an exemplary embodiment of the inventive concept, the thickness of the second insulating layer may be thinner than the thickness of the third insulating layer.

In an exemplary embodiment of the inventive concept, the compensation pattern may be made of a non-metal.

In an exemplary embodiment of the inventive concept, the third metal wire and the fourth metal wire may be positioned directly on the compensation pattern and the second insulating layer.

In an exemplary embodiment of the inventive concept, the display device may include a display region and a non-display region positioned on the edge of the display region, and the first metal wire, the second metal wire, the compensation pattern, the third metal wire, and the fourth metal wire may be positioned in the non-display region.

In an exemplary embodiment of the inventive concept, the display device may include a first semiconductor, a first gate electrode and a storage electrode. The first semiconductor may be positioned on the substrate. The first gate electrode may overlap the first semiconductor. The storage electrode may overlap the first gate electrode. The first semiconductor, the first gate electrode, and the storage electrode may be positioned in the display region. The first insulating layer may be positioned between the first gate electrode and the storage electrode. The first gate electrode may be positioned in a same first layer as the first metal wire. The storage electrode is positioned in a same second layer as the second metal wire.

In an exemplary embodiment of the inventive concept, the display device may include a second semiconductor, a second gate electrode, a data connecting member, a pixel electrode, an organic emission layer, and a common electrode. The second semiconductor may be positioned on the substrate. The second gate electrode may be positioned on the second semiconductor. The data connecting member may be connected to the second semiconductor. The pixel electrode may be connected to the data connecting member. The organic emission layer may be positioned on the pixel electrode. The common electrode may be positioned on the organic emission layer. The second semiconductor, the second gate electrode, the data connecting member, the pixel electrode, the organic emission layer, and the common electrode may be positioned in the display region. The first insulating layer and the second insulating layer may be positioned between the second gate electrode and the data connecting member. The second gate electrode may be positioned in the same first layer as the first metal wire. The data connecting member may be positioned in a same second layer as the third metal wire and the fourth metal wire.

According to an exemplary embodiment of the inventive concept, a method of manufacturing a display device includes forming a first metal wire extending in a first direction on a substrate. A first insulating layer is formed on the first metal wire and the substrate. A second metal wire extending in the first direction is formed on the first insulating layer, and adjacent to the first metal wire. A second insulating layer is formed on the first insulating layer and the second metal wire. A compensation layer is deposited on an entire surface of the second insulating layer. The entire surface of the compensation layer is etched. A third metal wire and a fourth metal wire extending in a second direction different from the first direction is formed on the second insulating layer. The second insulating layer is formed in a groove positioned between the first metal wire and the second metal wire. In the etching of the entire surface of the compensation layer, the compensation pattern remains in the groove.

In an exemplary embodiment of the inventive concept, the first insulating layer and the second insulating layer may be made of an inorganic insulating material.

In an exemplary embodiment of the inventive concept, the compensation pattern may be made of a material having a different etching rate from that of the second insulating layer.

In an exemplary embodiment of the inventive concept, the method may further include forming a third insulating layer on the second insulating layer and the compensation pattern, and the compensation pattern may be made of a metal.

In an exemplary embodiment of the inventive concept, the compensation pattern may be made of a non-metal.

According to an exemplary embodiment of the inventive concept, a display device includes a substrate, a first insulating layer, a first and second groove, a first and second compensation pattern, a first metal wire, and a second insulating layer. The first insulating layer is positioned on the substrate. The first and second grooves are disposed in the first insulating layer and extending in a first direction. The first and second compensation patterns are positioned in the first and second grooves. The first metal wire overlaps the first insulating layer and the first compensation pattern and extends in the first direction. The second insulating layer is positioned on the first insulating layer, the second compensation pattern and the first metal wire.

In an exemplary embodiment of the inventive concept, the display device may include a display region and a non-display region. The first and second compensation pattern and the first metal wire may be positioned in the non-display region.

In an exemplary embodiment of the inventive concept, a thickness of the first and second compensation patterns corresponds to a height of the first insulating layer.

In an exemplary embodiment of the inventive concept, the first and second compensation patterns have a different etching rate from the first insulating layer.

In an exemplary embodiment of the inventive concept, an upper surface of the second insulating layer is substantially flat.

BRIEF DESCRIPTION OF THE DRAWINGS

Exemplary embodiments of the inventive concept will be more clearly understood from the following detailed description taken in conjunction with the accompanying drawings.

DETAILED DESCRIPTION

Figure 1:
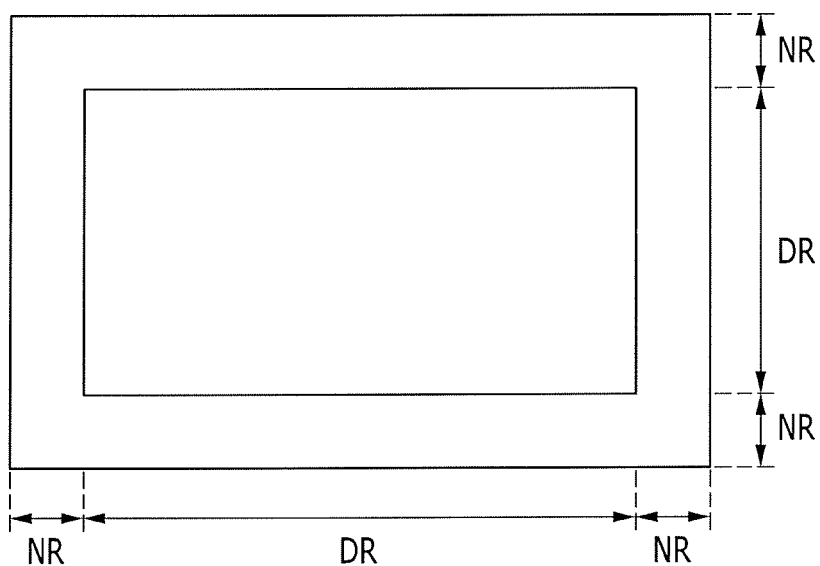
FIG. 1 is a layout view of a display device according to an exemplary embodiment of the inventive concept.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

A display device according to an exemplary embodiment of the inventive concept will be described with reference to FIG. 1.

FIG. 1 is a layout view of a display device according to an exemplary embodiment of the inventive concept.

The display device according to an exemplary embodiment includes a display region DR displaying an image, and a non-display region NR positioned on an edge of the display region DR. A plurality of pixels is disposed in the display region DR. A luminance is controlled for each pixel to display the image. A plurality of drivers driving the plurality of pixels is disposed in the non-display region NR.

Since the non-display region NR does not display the image, the non-display region NR may be covered by a light blocking member.

The non-display region NR of the display device according to an exemplary embodiment of the inventive concept will be described with reference to FIG. 2 and FIG. 3.

Figure 2:
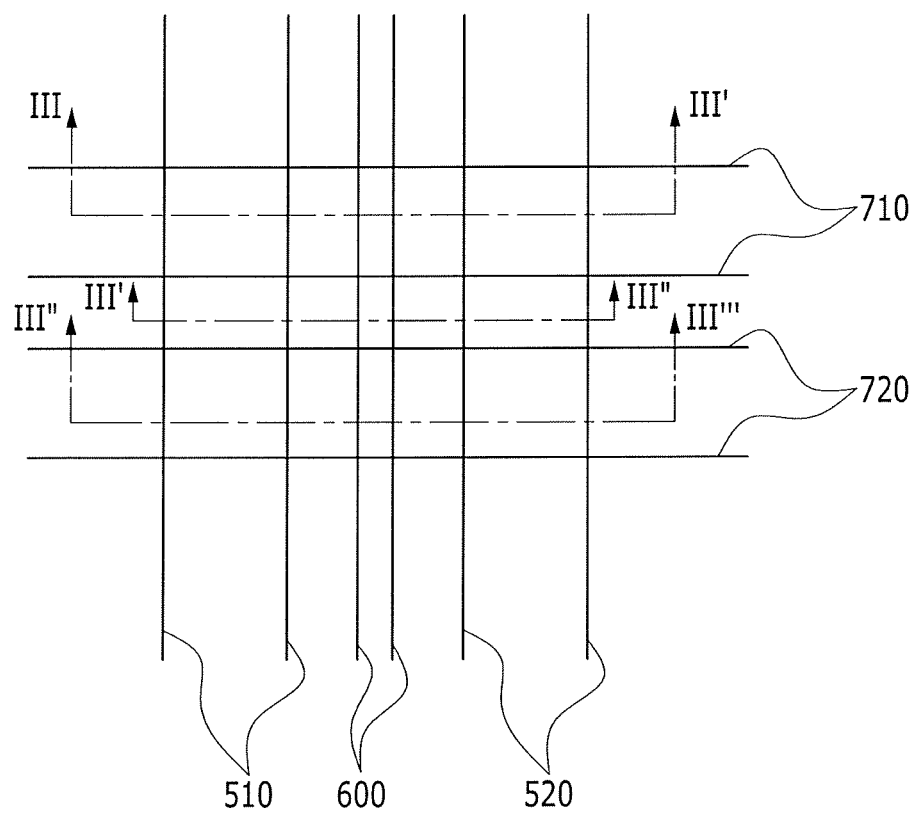
FIG. 2 is a layout view of a non-display region of a display device according to an exemplary embodiment of the inventive concept.
Figure 3:
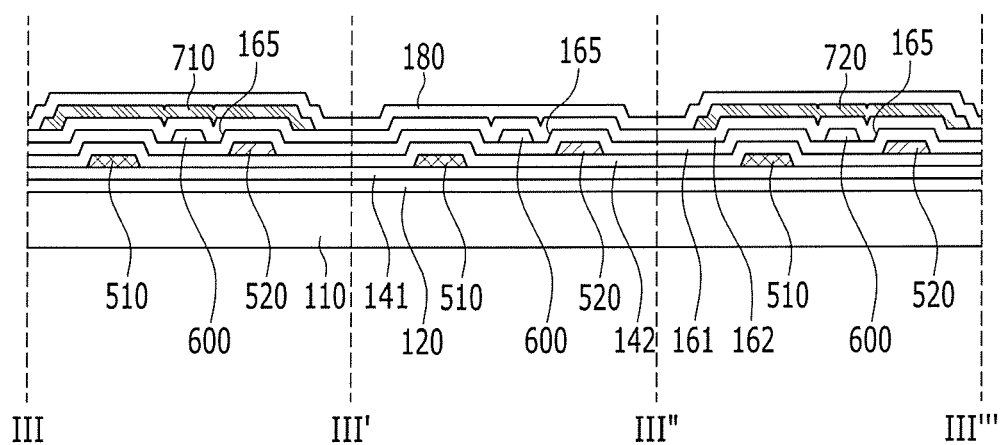
FIG. 3 is a cross-sectional view of a non-display region of a display device according to an exemplary embodiment of the inventive concept taken along lines III-III', III'-III'', and III''-III''' of FIG. 2.

FIG. 2 is a layout view of a non-display region of a display device according to an exemplary embodiment of the inventive concept, and FIG. 3 is a cross-sectional view of a non-display region of a display device according to an exemplary embodiment taken along lines III-III', III'-III'', and III''-III''' of FIG. 2.

As shown in FIG. 2 and FIG. 3, the display device according to an exemplary embodiment includes a substrate 110 and a first metal wire 510 positioned on the substrate 110.

The substrate 110 may be made of glass, plastic, or the like. A buffer layer 120 may be further formed on the substrate 110. The buffer layer 120 may be made of an inorganic insulating material such as a silicon nitride (SiNx) and/or a silicon oxide (SiOx). A first gate insulating layer 141 may be further formed on the buffer layer 120. The first gate insulating layer 141 may be made of the inorganic insulating material such as a silicon nitride (SiNx) and/or a silicon oxide (SiOx).

The first metal wire 510 may be disposed on the first gate insulating layer 141. The first metal wire 510 may extend in a first direction. For example, the first direction may be a horizontal direction.

A second gate insulating layer 142 may be disposed on the first metal wire 510 and the first gate insulating layer 141. The second gate insulating layer 142 may be made of the inorganic insulating material such as a silicon nitride (SiNx) and/or a silicon oxide (SiOx).

A second metal wire 520 may be disposed on the second gate insulating layer 142. The second metal wire 520 may extend in the first direction parallel to the first metal wire 510. The second metal wire 520 is positioned to be close to the first metal wire 510.

A first interlayer insulating layer 161 may be disposed on the second metal wire 520 and the second gate insulating layer 142. The first interlayer insulating layer 161 may be made of the inorganic insulating material such as a silicon nitride (SiNx) and/or a silicon oxide (SiOx). The first interlayer insulating layer 161 is formed with a groove 165. The groove 165 may be disposed between the first metal wire 510 and the second metal wire 520 in a plan view. The groove 165 is formed along the first direction parallel to the first metal wire 510 and the second metal wire 520.

A compensation pattern 600 may be positioned on the first interlayer insulating layer 161. The compensation pattern 600 may be positioned in the groove 165. The compensation pattern 600 may extend in the first direction parallel to the first metal wire 510 and the second metal wire 520. The compensation pattern 600 may have a thickness corresponding to a depth of the groove 165. The compensation pattern 600 may be made of a material having a different etching ratio from that of the first interlayer insulating layer 161. For example, the compensation pattern 600 may be made of a metal.

A second interlayer insulating layer 162 may be positioned on the compensation pattern 600 and the first interlayer insulating layer 161. The second interlayer insulating layer 162 may be made of the inorganic insulating material such as a silicon nitride (SiNx) and/or a silicon oxide (SiOx). The first interlayer insulating layer 161 may be thinner than the second interlayer insulating layer 162.

A third metal wire 710 and a fourth metal wire 720 may be positioned on the second interlayer insulating layer 162. The third metal wire 710 and the fourth metal wire 720 may extend in the second direction that is different from the first direction. The second direction may be a direction that is perpendicular to the first direction. For example, the second direction may be a vertical direction. The third metal wire 710 and the fourth metal wire 720 may cross the first metal wire 510 and the second metal wire 520 in a plan view. The third metal wire 710 and the fourth metal wire 720 may be adjacent.

The compensation pattern 600 may be made of the same material as the third metal wire 710 and the fourth metal wire 720. The compensation pattern 600 may be positioned on a different layer from that of the third metal wire 710 and the fourth metal wire 720. The thickness of the compensation pattern 600 may be thinner than the thickness of the third metal wire 710 and the fourth metal wire 720.

A passivation layer 180 may be positioned on the third metal wire 710, the fourth metal wire 720, and the second interlayer insulating layer 162.

The first metal wire 510, the second metal wire 520, the compensation pattern 600, the third metal wire 710, and the fourth metal wire 720 are positioned in the non-display region NR. A driver may include the first metal wire 510, the second metal wire 520, the third metal wire 710, and the fourth metal wire 720. Signals to drive a pixel are applied to the first metal wire 510, the second metal wire 520, the third metal wire 710, and the fourth metal wire 720. For example, a driving voltage (ELVDD), a common voltage (ELVSS), and the like may be applied.

In an exemplary embodiment of the inventive concept, the first metal wire 510 and the second metal wire 520 may be adjacent and extend in a direction parallel to each other. The first interlayer insulating layer 161 made of the inorganic insulating material may be positioned on the first metal wire 510 and the second metal wire 520. Accordingly, the upper surface of the first interlayer insulating layer 161 is not flat and the groove 165 is formed between the first metal wire 510 and the second metal wire 520. The compensation pattern 600 is formed in the groove 165, and the second interlayer insulating layer 162 is formed on the compensation pattern 600 and the first interlayer insulating layer 161. Since the groove 165 is filled by the compensation pattern 600, the upper surface of the second interlayer insulating layer 162 may be substantially flat.

The manufacturing method of the display device according to an exemplary embodiment of the inventive concept will be described with reference to FIG. 4 to FIG. 7.

FIG. 4 to FIG. 7 are process cross-sectional views of a manufacturing method of a display device according to an exemplary embodiment of the inventive concept. FIG. 4 to FIG. 7 show the manufacturing method of the non-display region of the display device according to an exemplary embodiment. The display region may also be manufactured together therewith when manufacturing the non-display region.

Figure 4:
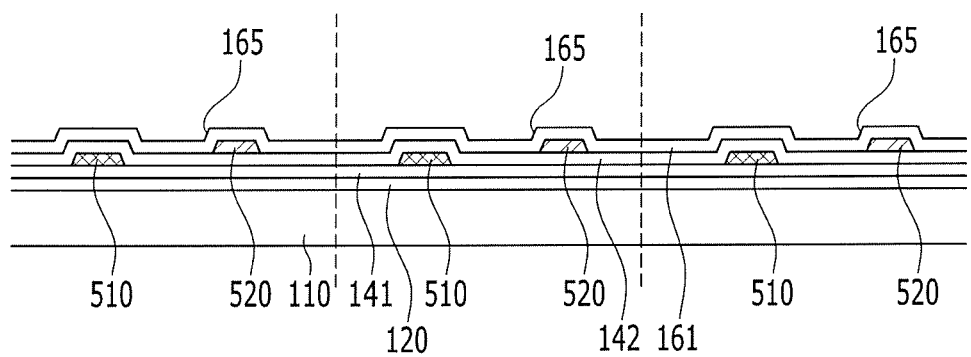
FIG. 4 to FIG. 7 are process cross-sectional views of a manufacturing method of a display device according to an exemplary embodiment of the inventive concept.

As shown in FIG. 4, the inorganic insulating material such as a silicon nitride (SiNx) and/or a silicon oxide (SiOx) is deposited on the substrate 110 to form the buffer layer 120. The inorganic insulating material such as a silicon nitride (SiNx) and/or a silicon oxide (SiOx) is deposited on the buffer layer 120 to form the first gate insulating layer 141.

A metal material is deposited and patterned on the first gate insulating layer 141 to form the first metal wire 510. The first metal wire 510 may extend in the first direction. The inorganic insulating material such as a silicon nitride (SiNx) and/or a silicon oxide (SiOx) is deposited on the first metal wire 510 and the first gate insulating layer 141 to form the second gate insulating layer 142. A metal material is deposited and patterned on the second gate insulating layer 142 to form the second metal wire 520. The second metal wire 520 may extend in the first direction parallel to the first metal wire 510.

The inorganic insulating material such as a silicon nitride (SiNx) and/or a silicon oxide (SiOx) is deposited on the second metal wire 520 and the second gate insulating layer 142 to form the first interlayer insulating layer 161. The first interlayer insulating layer 161 includes the groove 165. The groove 165 may be positioned between the first metal wire 510 and the second metal wire 520 in a plan view.

Figure 5:
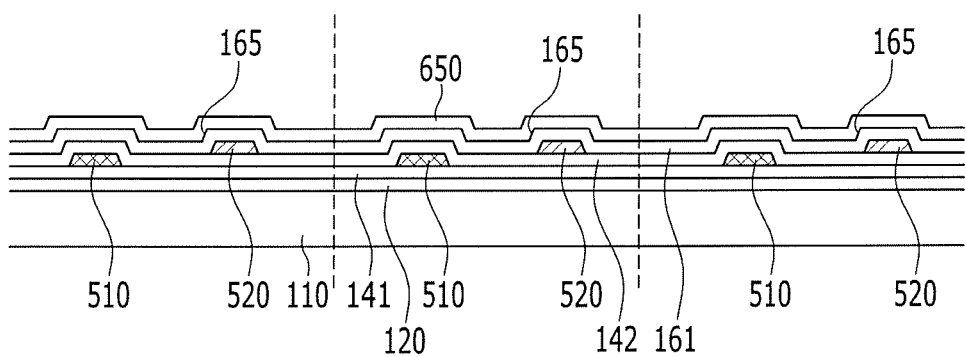

As shown in FIG. 5, a compensation layer 650 may be deposited on the entire surface of the first interlayer insulating layer 161. The compensation layer 650 may be made of material having a different etching rate from that of the first interlayer insulating layer 161. For example, the compensation layer 650 may be made of the metal material. The compensation layer 650 fills the groove 165.

Figure 6:
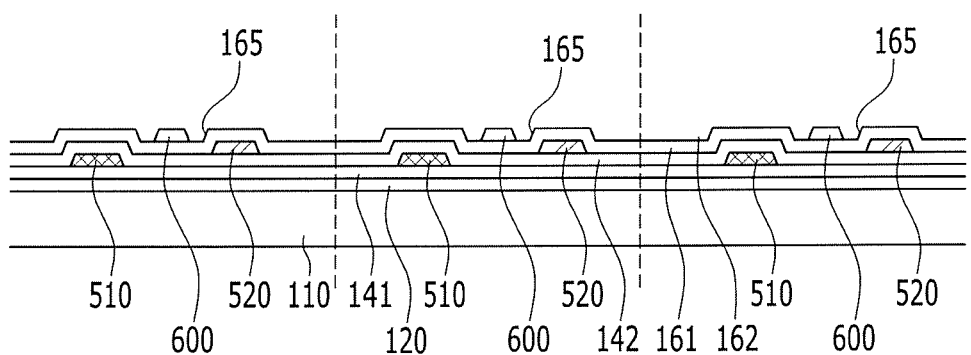

As shown in FIG. 6, the substantially all of a surface of the compensation layer 650 may be etched. When substantially all of the surface of the compensation layer 650 is etched without a separate mask, most of the compensation layer 650 is removed. However, the compensation layer 650 positioned in the groove 165 remains, forming the compensation pattern 600.

Since the compensation layer 650 is made of the material having the different etching rate from that of the first interlayer insulating layer 161, the portions of the first interlayer insulating layer 161 are not etched during the etching of the compensation layer 650.

Figure 7:
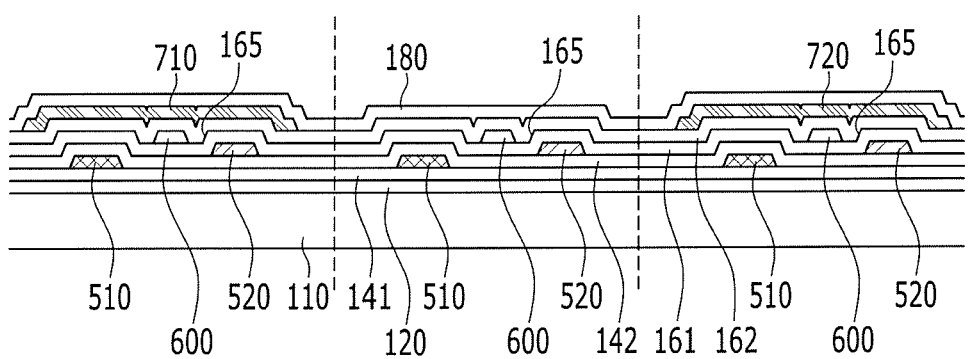

As shown in FIG. 7, the inorganic insulating material such as silicon nitride (SiNx) and/or a silicon oxide (SiOx) is deposited on the compensation pattern 600 and the first interlayer insulating layer 161 to form the second interlayer insulating layer 162. The first interlayer insulating layer 161 may be thinner than the second interlayer insulating layer 162.

Since the first interlayer insulating layer 161 includes the groove 165, the upper surface of the first interlayer insulating layer 161 is not flat. Since the compensation pattern 600 is filled inside the groove 165 of the first interlayer insulating layer 161, the upper surface of the second interlayer insulating layer 162 formed on the first interlayer insulating layer 161 and the compensation pattern 600 may be substantially flat.

The metal material is deposited and patterned on the second interlayer insulating layer 162 to form the third metal wire 710 and the fourth metal wire 720. The third metal wire 710 and the fourth metal wire 720 may extend in the second direction that is different from the first direction. The second direction may be a direction that is perpendicular to the first direction.

When the compensation pattern 600 is made of the metal material, the compensation pattern 600 may be made of the same material as the third metal wire 710 and the fourth metal wire 720. The compensation pattern 600 may be thinner than the third metal wire 710 and the fourth metal wire 720.

The passivation layer 180 is formed on the third metal wire 710, the fourth metal wire 720, and the second interlayer insulating layer 162.

The non-display region of the display device according to an exemplary embodiment of the inventive concept will be described with reference to FIG. 8.

Figure 8:
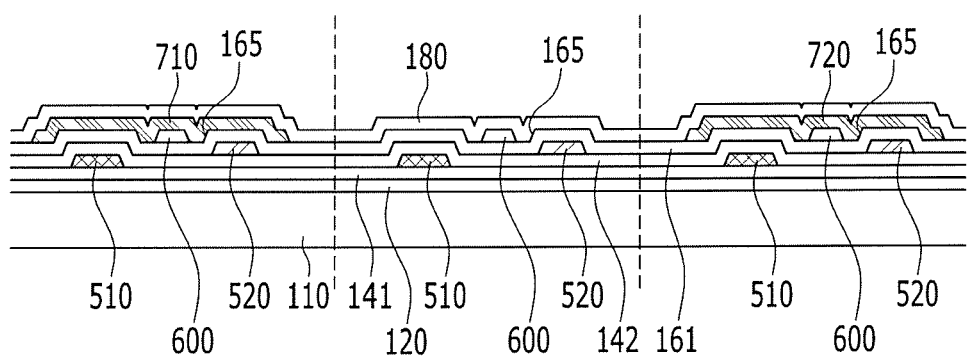
FIG. 8 is a cross-sectional view of a non-display region of a display device according to an exemplary embodiment of the inventive concept.

The display device according to an exemplary embodiment of the inventive concept shown in FIG. 8 is similar to the display devices according to exemplary embodiments shown in FIG. 1 to FIG. 3 and the description thereof is omitted. In the present exemplary embodiment of the inventive concept, the second interlayer insulating layer is omitted.

FIG. 8 is a cross-sectional view of a non-display region of a display device according to an exemplary embodiment of the inventive concept.

As shown in FIG. 8, the first metal wire 510 is positioned on the substrate 110, the second gate insulating layer 142 is positioned on the first metal wire 510 and the first gate insulating layer 141. The second metal wire 520 is positioned on the second gate insulating layer 142. The first interlayer insulating layer 161 is positioned on the second metal wire 520 and the second gate insulating layer 142. The compensation pattern 600 is positioned in the groove 165 of the first interlayer insulating layer 161.

The compensation pattern 600 may be made of the material having the different etching rate from that of the first interlayer insulating layer 161. In this case, the compensation pattern 600 may be made of the non-metal material.

In the previous exemplary embodiment (e.g., FIG. 7), the second interlayer insulating layer is positioned on the compensation pattern 600 and the first interlayer insulating layer 161. According to the present embodiment, the second interlayer insulating layer is omitted. The third metal wire 710 and the fourth metal wire 720 are positioned directly on the compensation pattern 600 and the first interlayer insulating layer 161. In an exemplary embodiment of the inventive concept, the compensation pattern 600 is formed using a metal material, an additional insulating layer may be formed on the compensation pattern 600 to prevent the compensation pattern 600 from short-circuiting the third metal wire 710 and the fourth metal wire 720. In an exemplary embodiment of the inventive concept, the compensation pattern 600 may be made using a non-metal material, and no additional insulating layer is needed on the compensation pattern 600. In this exemplary embodiment the compensation pattern 600 does not short-circuit the third metal wire 710 and the fourth metal wire 720.

The non-display region of the display device according to an exemplary embodiment of the inventive concept will be described with reference to FIG. 9 and FIG. 10.

Figure 9:
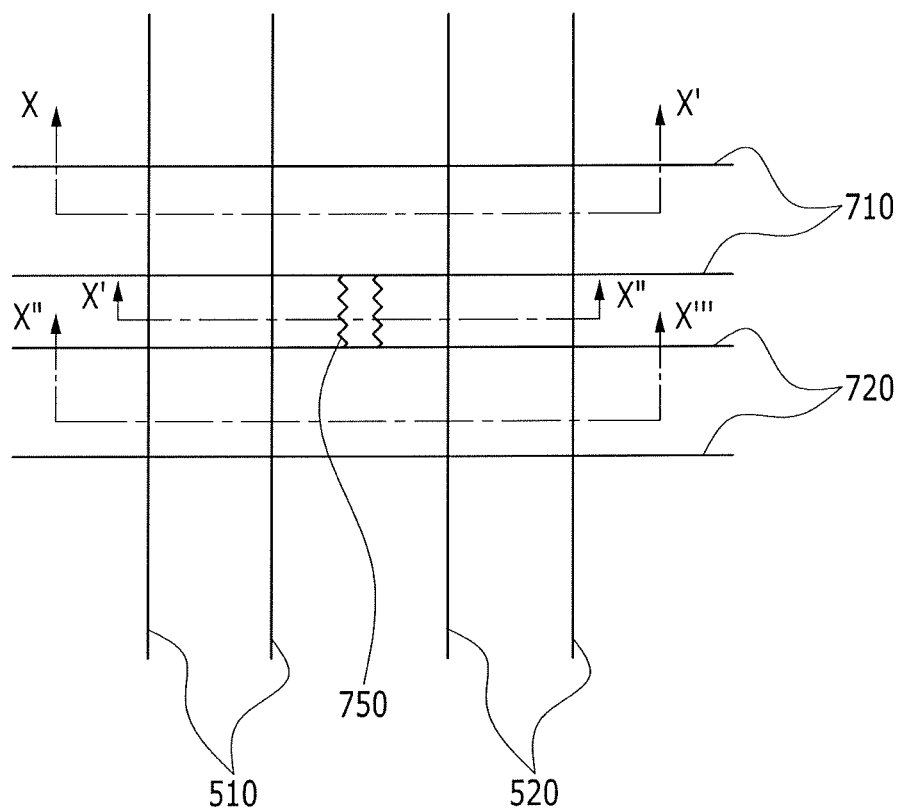
FIG. 9 is a layout view of a non-display region of a display device according to a reference example.
Figure 10:
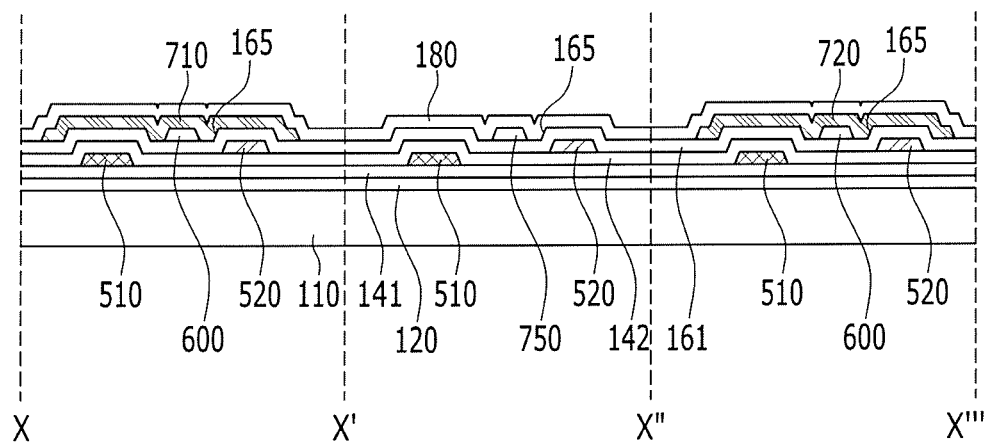
FIG. 10 is a cross-sectional view of a non-display region of a display device according to exemplary embodiment of the inventive concept taken along lines X-X', X'-X'', and X''-X''' of FIG. 9.

FIG. 9 is a layout view of a non-display region of a display device according to an exemplary embodiment of the inventive concept, and FIG. 10 is a cross-sectional view of a non-display region of a display device according to exemplary embodiment taken along lines X-X', X'-X'', and X''-X''' of FIG. 9.

As shown in FIG. 9 and FIG. 10, in the display device according to an exemplary embodiment of the inventive concept, the first metal wire 510 is positioned on the substrate 110, the second gate insulating layer 142 is positioned on the first metal wire 510 and the first gate insulating layer 141, and the second metal wire 520 is positioned on the second gate insulating layer 142.

The first interlayer insulating layer 161 is positioned on the second metal wire 520 and the second gate insulating layer 142. The first interlayer insulating layer 161 forms the groove 165 between the first metal wire 510 and the second metal wire 520. The groove 165 is formed along the first direction parallel to the first metal wire 510 and the second metal wire 520.

The third metal wire 710 and the fourth metal wire 720 are positioned on the first interlayer insulating layer 161. The metal material is deposited and patterned on the first interlayer insulating layer 161 to form the third metal wire 710 and the fourth metal wire 720. In this case, the metal material positioned in the groove 165 is not removed in the etching process, but remains, forming a residue pattern 750. The residue pattern 750 may connect the third metal wire 710 and the fourth metal wire 720 and may short the third metal wire 710 and the fourth metal wire 720. The third metal wire 710 and the fourth metal wire 720 may transmit different signals, so when the third metal wire 710 and the fourth metal wire 720 are shorted, the driver may not operate normally.

In an exemplary embodiment of the inventive concept, the compensation pattern is formed to prevent the third metal wire 710 and the fourth metal wire 720 from being short-circuited. In the present exemplary embodiment, the first interlayer insulating layer 161 may contain multiple grooves 165. The compensation pattern 600 is positioned in one of the grooves 165 of the first interlayer insulating layer 161. As the compensation pattern 600 is positioned in the groove 165 of the first interlayer insulating layer 161, the residue pattern 750 may be prevented from being formed in the groove 165 or the residue pattern 750 may be removed from the groove 165. For example, the residue pattern 750 may be removed during etching. Accordingly, without a residue pattern 750 in the groove 165 the third metal wire 710 and the fourth metal wire 720 positioned on the first interlayer insulating layer 161, may not be short-circuited.

The display region of the display device according to an exemplary embodiment of the inventive concept will be described with reference to FIG. 11 to FIG. 15.

Figure 11:
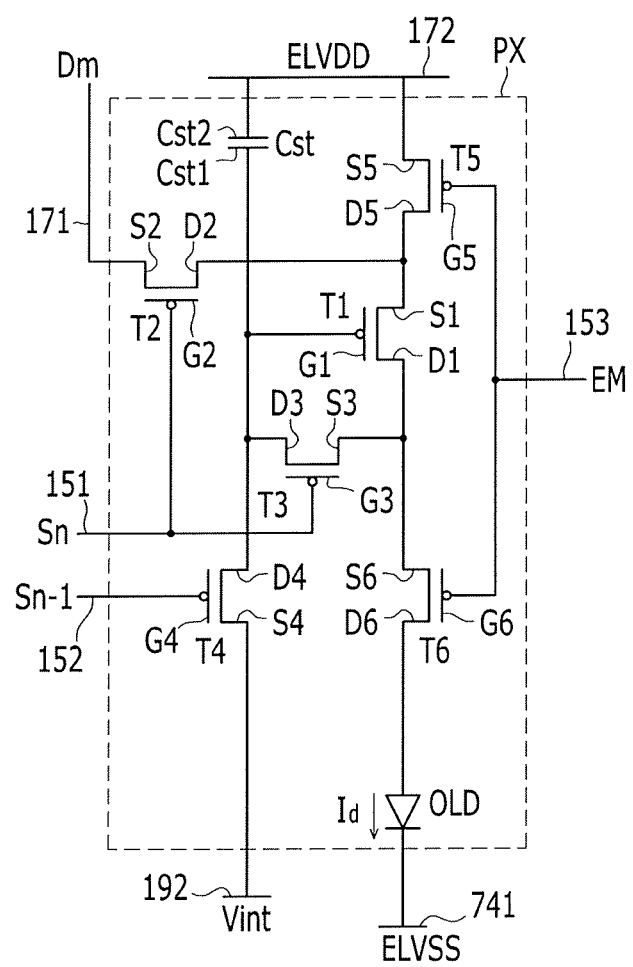
FIG. 11 is an equivalent circuit diagram of one pixel of a display region of a display device according to an exemplary embodiment of the inventive concept.

FIG. 11 is an equivalent circuit diagram of one pixel of a display region of a display device according to an exemplary embodiment of the inventive concept. The display device according to an exemplary embodiment may be made of an organic light emitting diode display.

As shown in FIG. 11, the display device according to an exemplary embodiment includes a plurality of signal lines 151, 152, 153, 171, 172, and 192 and a plurality of pixels PX connected to the plurality of signal lines and arranged substantially as a matrix.

Each pixel PX includes a plurality of transistors T1, T2, T3, T4, T5, and T6 connected to the plurality of signal lines 151, 152, 153, 171, 172, and 192, a storage capacitor Cst, and an organic light emitting diode OLD.

The transistors T1, T2, T3, T4, T5, and T6 include a driving transistor T1, a switching transistor T2, a compensation transistor T3, an initialization transistor T4, an operation control transistor T5, and a light emission control transistor T6. The signal lines 151, 152, 153, 171, 172, and 192 include a scan line 151 transmitting a scan signal Sn, a previous scan line 152 transmitting a previous scan signal S(n-1) to the initialization transistor T4, a light emission control line 153 transmitting a light emission control signal EM to the operation control transistor T5 and the light emission control transistor T6, a data line 171 crossing the scan line 151 and transmitting a data signal Dm, a driving voltage line 172 transmitting a driving voltage ELVDD and formed to be almost parallel to the data line 171, and an initialization voltage line 192 transmitting an initialization voltage Vint initializing the driving transistor T1.

A gate electrode G1 of the driving transistor T1 is connected to one end Cst1 of the storage capacitor Cst, a source electrode S1 of the driving transistor T1 is connected with the driving voltage line 172 via the operation control transistor T5. A drain electrode D1 of the driving transistor T1 is electrically connected with an anode of the organic light emitting diode OLD via the emission control transistor T6. The driving transistor T1 receives the data signal Dm according to a switching operation of the switching transistor T2 to supply a driving current Id to the organic light emitting diode OLD.

A gate electrode G2 of the switching transistor T2 is connected with the scan line 151, a source electrode S2 of the switching transistor T2 is connected with the data line 171, and a drain electrode D2 of the switching transistor T2 is connected with the source electrode S1 of the driving transistor T1. The drain electrode D2 of the switching transistor T2 is also connected with the driving voltage line 172 via the operation control transistor T5. The switching transistor T2 is turned on according to the scan signal Sn received through the scan line 121 to perform a switching operation transferring the data signal Dm from the data line 171 to the source electrode of the driving transistor T1.

A gate electrode G3 of the compensation transistor T3 is directly connected with the scan line 151, a source electrode S3 of the compensation transistor T3 is connected to the drain electrode D1 of the driving transistor T1 and with an anode of the organic light emitting diode OLD via the light emission control transistor T6. A drain electrode D3 of the compensation transistor T3 is connected with one end Cst1 of the storage capacitor Cst, the drain electrode D4 of the initialization transistor T4, and the gate electrode G1 of the driving transistor T1. The compensation transistor T3 is turned on according to the scan signal Sn received through the scan line 151 to connect the gate electrode G1 and the drain electrode D1 of the driving transistor T1 resulting in the driving transistor T1 acting as a diode-connected transistor.

A gate electrode G4 of the initialization transistor T4 is connected with the previous scan line 152, a source electrode S4 of the initialization transistor T4 is connected with the initialization voltage line 192. A drain electrode D4 of the initialization transistor T4 is connected with one end Cst1 of the storage capacitor Cst and the gate electrode G1 of the driving transistor T1 together through the drain electrode D3 of the compensation transistor T3. The initialization transistor T4 is turned on according to a previous scan signal S(n-1) received through the previous scan line 152 to transfer the initialization voltage Vint to the gate electrode G1 of the driving transistor T1 and initialize a voltage of the gate electrode G1 of the driving transistor T1.

A gate electrode G5 of the operation control transistor T5 is connected with the light emission control line 153, a source electrode S5 of the operation control transistor T5 is connected with the driving voltage line 172. A drain electrode D5 of the operation control transistor T5 is connected with the source electrode S1 of the driving transistor T1 and the drain electrode D2 of the switching transistor T2.

A gate electrode G6 of the light emission control transistor T6 is connected to the light emission control line 153, the source electrode S6 of the light emission control transistor T6 is connected to the drain electrode D1 of the driving transistor T1 and the source electrode S3 of the compensation transistor T3. The drain electrode D6 of the first light emission control transistor T6 is electrically connected to the anode of the organic light emitting diode OLD. The operation control transistor T5 and the light emission control transistor T6 are simultaneously turned on according to the light emission control signal EM transmitted to the light emission control line 153. When the operation control transistor T5 and the light emission control transistor T6 are turned-on the driving voltage ELVDD is transmitted through the diode-connected driving transistor T1 to the organic light emitting diode OLD.

The other end Cst2 of the storage capacitor Cst is connected with the driving voltage line 172. A cathode of the organic light emitting diode OLD is connected with a common voltage line 741 transferring a common voltage ELVSS.

The detailed structure of the organic light emitting diode display according to an exemplary embodiment of the inventive concept shown in FIG. 11 will be described with reference to FIG. 12 to FIG. 15.

Figure 12:
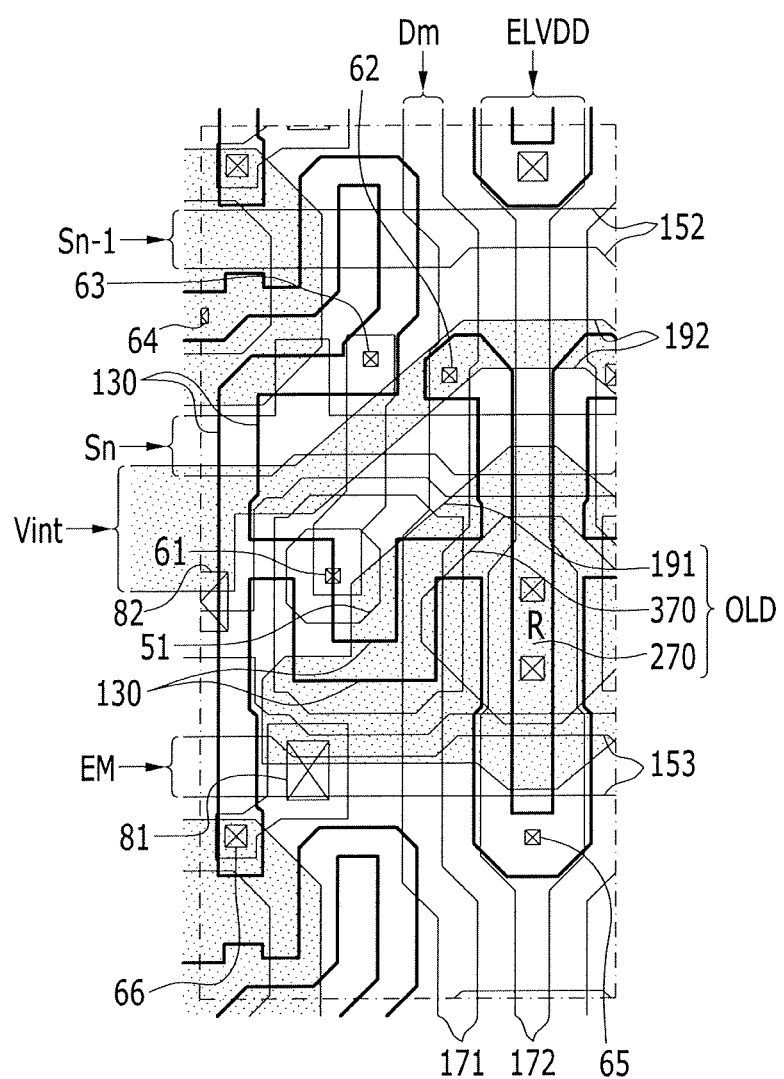
FIG. 12 is a layout view of a plurality of transistors and a capacitor of an organic light emitting diode display according to an exemplary embodiment of the inventive concept.
Figure 13:
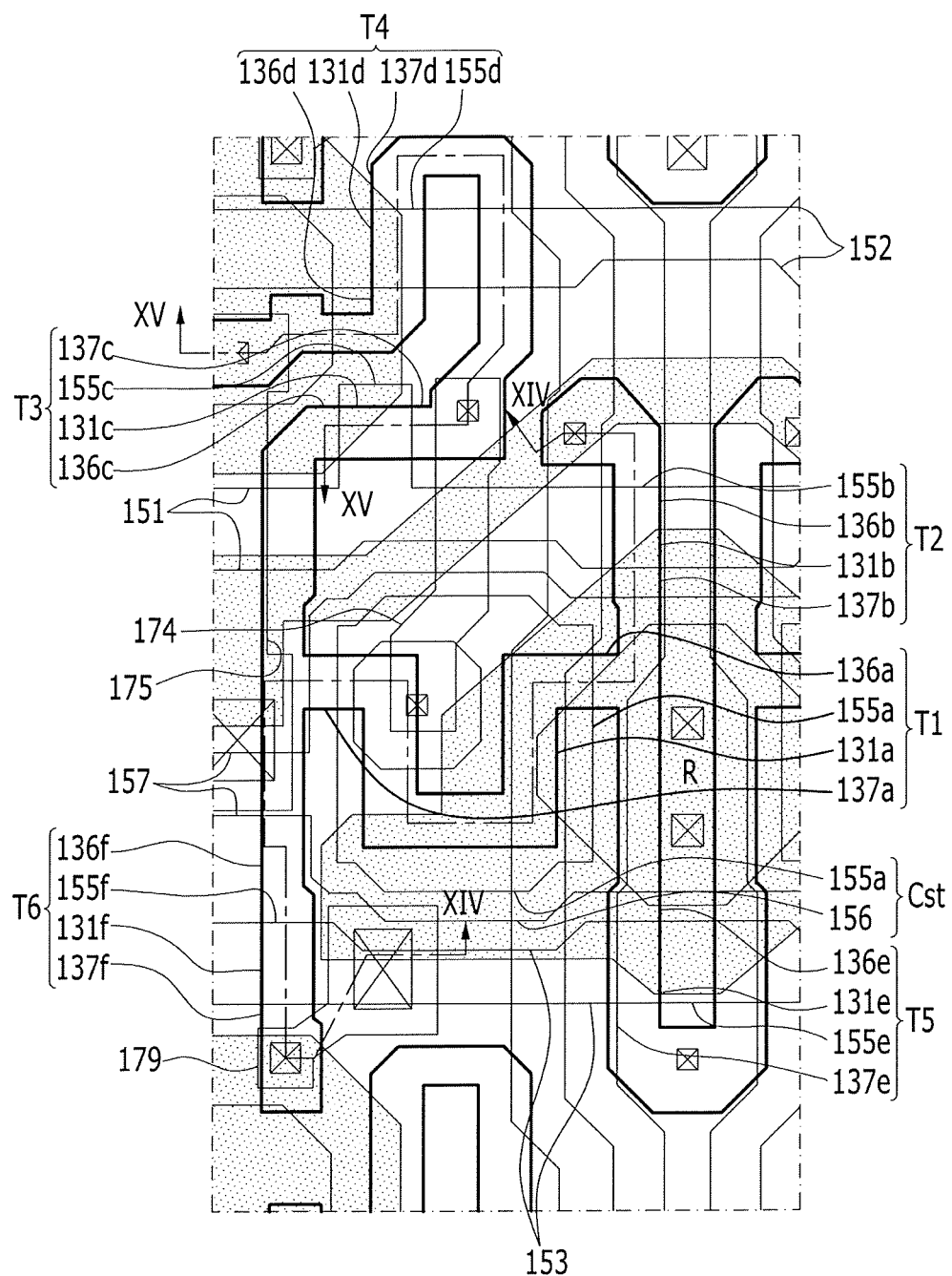
FIG. 13 is a detail layout view of FIG. 12.
Figure 14:
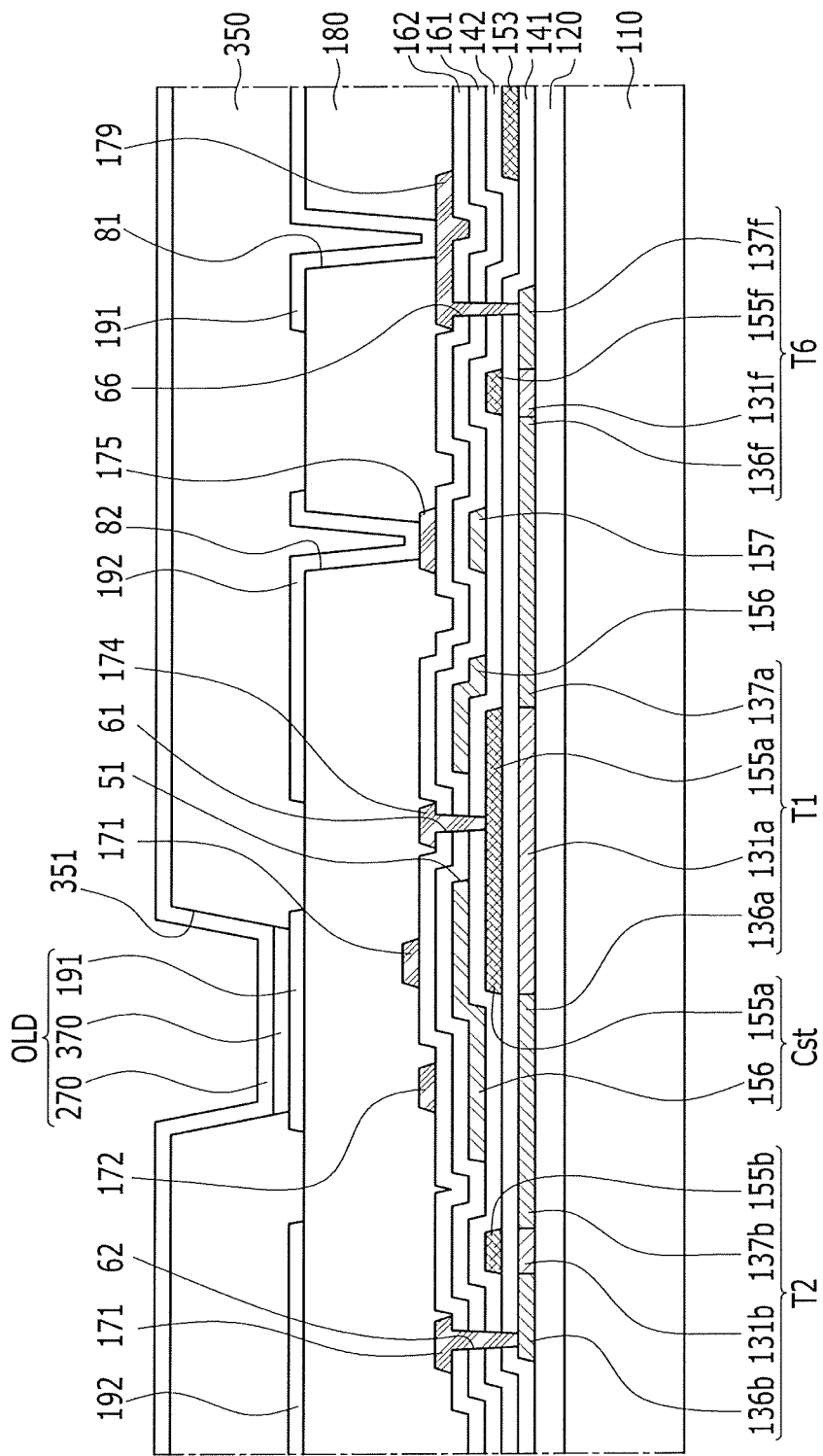
FIG. 14 is a cross-sectional view of the display device according to an exemplary embodiment of the inventive concept of FIG. 13 taken along a line XIV-XIV.
Figure 15:
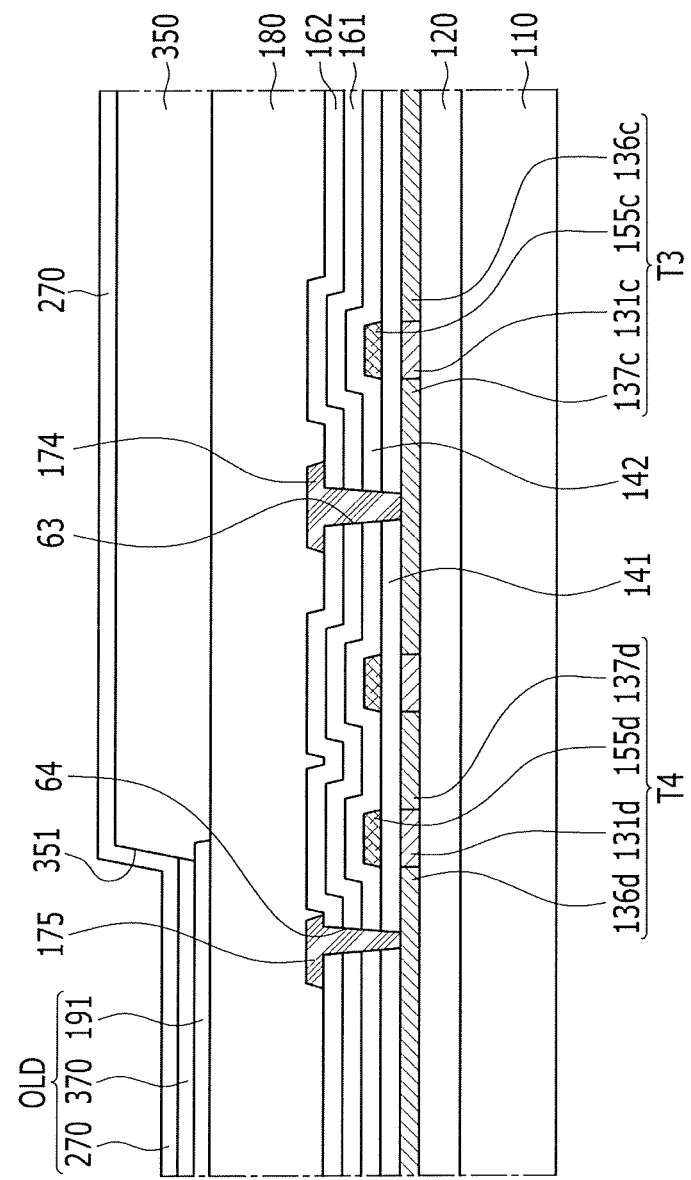
FIG. 15 is a cross-sectional view of the display device according to an exemplary embodiment of the inventive concept of FIG. 13 taken along a line XV-XV.

FIG. 12 is a layout view of a plurality of transistor and a capacitor of an organic light emitting diode display according to an exemplary embodiment. FIG. 13 is a detail layout view of FIG. 12. FIG. 14 is a cross-sectional view of the display device of FIG. 13 taken along a line XIV-XIV. FIG. 15 is a cross-sectional view of the display device of FIG. 13 taken along a line XV-XV.

Hereinafter, a detailed planar structure of the organic light emitting diode display device according to the exemplary embodiment will be first described in detail with reference to FIG. 12 and FIG. 13. A detailed cross-sectional structure will be described in detail with reference to FIG. 14 and FIG. 15.

The organic light emitting diode display according to an exemplary embodiment includes a scan line 151, a previous scan line 152, and a light emission control line 153 respectively applying the scan signal Sn, the previous scan signal S(n−1), and the light emission control signal EM. The scan line 151, the previous scan line 152, and the light emission control line 153 may be formed along the row direction. A data line 171 and a driving voltage line 172 respectively apply the data signal Dm and the driving voltage ELVDD to the pixel PX. Additionally, data line 171 and a driving voltage line 172 cross the scan line 151, the previous scan line 152, and the light emission control line 153. The initialization voltage Vint is transmitted from the initialization voltage line 192 through the initialization transistor T4 to the compensation transistor T3. The initialization voltage line 192 is formed while alternately having a straight portion and an oblique portion.

Each pixel PX may include the driving transistor T1, the switching transistor T2, the compensation transistor T3, the initialization transistor T4, the operation control transistor T5, the light emission control transistor T6, the storage capacitor Cst, and the organic light emitting diode OLD.

The organic light emitting diode OLD is made of a pixel electrode 191, an organic emission layer 370, and a common electrode 270. In this case, the initialization transistor T4 may have a dual gate structure transistor to block a leakage current.

Each channel of the driving transistor T1, the switching transistor T2, the compensation transistor T3, the initialization transistor T4, the operation control transistor T5, and the light emission control transistor T6 is formed inside one semiconductor 130. Additionally, the semiconductor 130 may be formed to be curved in various shapes. The semiconductor 130 may be made of a polycrystalline semiconductor material or an oxide semiconductor material.

The semiconductor 130 includes a channel which is doped with an N-type impurity or a P-type impurity. A source doping part and a drain doping part which are formed at opposite sides of the channel and are doped with an opposite-type doping impurity to the doping impurity doped on the channel. In the exemplary embodiment of the inventive concept, the source doping part and the drain doping part correspond to the source electrode and the drain electrode, respectively. The source electrode and the drain electrode formed in the semiconductor 130 may be formed by doping only the corresponding regions. Further, in the semiconductor 130, a region between source electrodes and drain electrodes of different transistors is doped, and thus the source electrode and the drain electrode may be electrically connected to each other.

The channel includes a driving channel 131a formed in the driving transistor T1, a switching channel 131b formed in the switching transistor T2, a compensation channel 131c formed in the compensation transistor T3, an initialization channel 131d formed in the initialization transistor T4, an operation control channel 131e formed in the operation control transistor T5, and a light emission control channel 131f formed in the light emission control transistor T6.

The driving transistor T1 includes the driving channel 131a, a driving gate electrode 155a, a driving source electrode 136a, and a driving drain electrode 137a. The driving channel 131a is curved and may have a meandering shape or a zigzag shape. As such, by forming the curved driving channel 131a, the driving channel 131a may be formed in a narrow space. Accordingly, a driving range of the driving gate-source voltage Vgs between the driving gate electrode 155a and the driving source electrode 136a is increased by the elongated driving channel 131a. The driving range of the driving gate-source voltage Vgs means a difference between the maximum driving gate-source voltage of the driving transistor corresponding to the maximum gray and the minimum driving gate-source voltage of the driving transistor corresponding to the minimum gray or the difference between the driving gate-source voltages Vgs for each step for the gray expression. Since the driving range of the gate voltage is increased, a gray scale of light emitted from the organic light emitting diode OLD may be finely controlled by changing the magnitude of the gate voltage. As a result, the resolution and display quality of the organic light emitting diode display device may be increased. Various examples such as 'reverse S', 'S', 'M', and 'W' may be implemented by variously modifying the shape of the driving channel 131a.

The driving gate electrode 155a overlaps with the driving channel 131a. The driving source electrode 136a and the driving drain electrode 137a are formed at opposite sides of the driving channel 131a to be close to the driving channel 131a. The driving gate electrode 155a is connected to a first data connecting member 174 through a contact hole 61.

The switching transistor T2 includes the switching channel 131b, a switching gate electrode 155b, a switching source electrode 136b, and a switching drain electrode 137b. The switching gate electrode 155b which is some of the portion extending downward from the scan line 151 overlaps the switching channel 131b. The switching source electrode 136b and the switching drain electrode 137b are formed to be adjacent to the switching channel 131b, and are on opposite sides of the switching channel 131b. The switching source electrode 136b is connected to the data line 171 through a contact hole 62.

The compensation transistor T3 includes the compensation channel 131c, a compensation gate electrode 155c, a compensation source electrode 136c, and a compensation drain electrode 137c. The compensation gate electrode 155c is a part of the scan line 151 and overlaps the compensation channel 131c. The compensation source electrode 136c and the compensation drain electrode 137c are formed to be adjacent to the compensation channel 131c, and are on opposite sides of the compensation channel 131c. The compensation drain electrode 137c is connected to the first data connecting member 174 through a contact hole 63.

The initialization transistor T4 includes the initialization channel 131d, an initialization gate electrode 155d, an initialization source electrode 136d, and an initialization drain electrode 137d. The initialization gate electrode 155d is a part of the previous scan line 152 and has a dual gate structure to prevent the leakage current. The initialization gate electrode 155d overlaps the initialization channel 131d. The initialization source electrode 136d and the initialization drain electrode 137d are formed to be adjacent to the initialization channel 131d, and are on opposite sides of the initialization channel 131d. The initialization source electrode 136d is connected to a second data connecting member 175 through a contact hole 64.

The operation control transistor T5 includes the operation control channel 131e, an operation control gate electrode 155e, an operation control source electrode 136e, and an operation control drain electrode 137e. The operation control gate electrode 155e is a part of the light emission control line 153 and overlaps the operation control channel 131e. The operation control source electrode 136e and the operation control drain electrode 137e are formed to be adjacent to the operation control channel 131e, and are on opposite sides of the operation control channel 131e. The operation control source electrode 136e is connected to a part that extends from the driving voltage line 172 through a contact hole 65.

The light emission control transistor T6 includes the light emission control channel 131f, a light emission control gate electrode 155f, a light emission control source electrode 136f, and a light emission control drain electrode 137f. The light emission control gate electrode 155f is a part of the light emission control line 153 and overlaps the light emission control channel 131f. The light emission control source electrode 136f and the light emission control drain electrode 137f are formed to be adjacent to the light emission control channel 131f, and are on opposite sides of the light emission control channel 131f. The light emission control drain electrode 137f is connected to a third data connecting member 179 through a contact hole 66.

One end of the driving channel 131a of the driving transistor T1 is connected to the switching drain electrode 137b and the operation control drain electrode 137e. The other end of the driving channel 131a is connected to the compensation source electrode 136c and the light emission control source electrode 136f.

The storage capacitor Cst includes a first storage electrode 155a and a second storage electrode 156 with the second gate insulating layer 142 disposed between the first storage electrode 155a and the second storage electrode 156. The first storage electrode 155a corresponds to the driving gate electrode 155a. The second storage electrode 156 is a portion extending from a storage line 157 and occupies a wider area than that of the driving gate electrode 155a and substantially covers the driving gate electrode 155a.

In an exemplary embodiment of the inventive concept, the second gate insulating layer 142 is a dielectric material, and the storage capacitance is determined by a charge in the storage capacitor Cst and a voltage between both electrodes 155a and 156. The driving gate electrode 155a is used as the first storage electrode 155a, and thus the storage capacitor Cst may be formed in a narrow space due to the driving channel 131a occupying a large area within the pixel.

The first storage electrode 155a which is the driving gate electrode 155a is connected to one end of the driving connecting member 174 through the contact hole 61 and a storage opening 51. The storage opening 51 is an opening which is formed in the second storage electrode 156. Accordingly, the contact hole 61 connecting one end of the driving connecting member 174 and the driving gate electrode 155a is formed inside the storage opening 156. The first driving connecting member 174 is formed in the same layer as the data line 171 to be almost parallel to the data line 171. The other end of the first driving connecting member 174 is connected to the compensation drain electrode 137c of the compensation transistor T3 through the contact hole 63. The other end of the first driving connecting member 174 connects to the initialization drain electrode 137d of the initialization transistor T4 via the compensation drain electrode 137c of the compensation transistor T3. Accordingly, the first driving connecting member 174 connects the driving gate electrode 155a and the compensation drain electrode 137c of the compensation transistor T3 and the initialization drain electrode 137d of the initialization transistor T4 to each other.

The storage capacitor Cst stores capacitance charge corresponding to a difference between the driving voltage ELVDD transmitted to the second storage electrode 156 through the driving voltage line 172 and the gate voltage Vg of the driving gate electrode 155a.

The third data connecting member 179 is connected to the pixel electrode 191 through a contact hole 81, and the second data connecting member 175 is connected to the initialization voltage line 192 through a contact hole 82.

Hereinafter, the cross-sectional structures of the display device according to an exemplary embodiment will be described in detail according to a stacking order.

The buffer layer 120 may be formed on the insulating substrate 110. The buffer layer 120 may be formed on the entire surface of the substrate 110 including the display region and the non-display region.

The semiconductor 130 including the channel including the driving channel 131a, the switching channel 131b, the compensation channel 131c, the initialization channel 131d, the operation control channel 131e, and the light emission control channel 131f is formed on the buffer layer 120. The driving source electrode 136a and the driving drain electrode 137a are formed on opposite sides of the driving channel 131a in the semiconductor 130. The switching source electrode 136b and the switching drain electrode 137b are formed on opposite sides of the switching channel 131b. The compensation source electrode 136c and the compensation drain electrode 137c are formed at opposite sides of the compensation channel 131c. The initialization source electrode 136d and the initialization drain electrode 137d are formed at opposite sides of the initialization channel 131d. The operation control source electrode 136e and the operation control drain electrode 137e are formed at opposite sides of the operation control channel 131e. The emission control source electrode 136f and the emission control drain electrode 137f are formed at opposite sides of the emission control channel 131f.

The first gate insulating layer 141 covering the semiconductor 130 is formed thereon. The first gate insulating layer 141 is formed on substantially all of the display region and the non-display region.

First gate wires (151, 152, 153, 155a, 155b, 155c, 155d, 155e, and 155f) including the switching gate electrode 155b, the scan line 151 including the compensation gate electrode 155c, the previous scan line 152 including the initialization gate electrode 155d, the light emission control line 153 including the operation control gate electrode 155e and the light emission control gate electrode 155f, and the driving gate electrode (the first storage electrode) 155a are formed on the first gate insulating layer 141. The first gate wires (151, 152, 153, 155a, 155b, 155c, 155d, 155e, and 155f) may be made of the same material as the first metal wire (referring to 510 of FIG. 3) positioned on the non-display region, and may be positioned in the same layer thereof.

The second gate insulating layer 142 covers the first gate wires (151, 152, 153, 155a, 155b, 155c, 155d, 155e, and 155f) and the first gate insulating layer 141 is formed thereon. The second gate insulating layer 142 is formed on the display region and the non-display region.

Second gate wires 157 and 156 are formed on the second gate insulating layer 142. The storage line 157 is parallel to the scan line 151 and the second storage electrode 156 is a portion extending from the storage line 157. The second gate wires 157 and 156 may be made of the same material as the second metal wire (referring to 520 of FIG. 3) positioned in the non-display region, and may be positioned in the same layer thereof.

The second storage electrode 156 is wider than the first storage electrode 155a such that the second storage electrode 156 may cover the entire driving gate electrode 155a. The first storage electrode 155a is driving gate electrode.

The first interlayer insulating layer 161 is formed on the second gate insulating layer 142 and the second gate wires 157 and 156. The first interlayer insulating layer 161 is formed on substantially all of the display region and the non-display region.

The first interlayer insulating layer 161 has contact holes 61, 62, 63, 64, 65, and 66 exposing at least part of the upper surface of the semiconductor 130 or the driving gate electrode 155a.

The second interlayer insulating layer 162 may be formed on the first interlayer insulating layer 161. The second interlayer insulating layer 162 is formed on the display region and the non-display region. In an exemplary embodiment, the second interlayer insulating layer 162 may be omitted.

Data wires (171, 172, 174, 175, and 179) including the data line 171, the driving voltage line 172, the first data connecting member 174, the second data connecting member 175, and the third data connecting member 179 are formed on the second interlayer insulating layer 162. The data wires (171, 172, 174, 175, and 179) may be made of the same material as the third metal wire (referring to 710 of FIG. 3) and the fourth metal wire (referring to 720 of FIG. 3) positioned in the non-display region, and may be positioned in the same layer thereof.

In an exemplary embodiment of the inventive concept, the data wires may be formed similarly to the third metal wire and fourth metal wire of FIG. 8. For example, the driving drain electrode 137a and the light emission control line 153 may form a groove in the upper layers including the second gate insulating layer 142, first interlayer insulating layer 161, and the second interlayer insulating layer 162. A compensation pattern 600 may be positioned in the groove on the second interlayer insulating layer 162. The third data connecting member 179 may be formed over the compensation pattern 600 and the interlayer insulating layer 162.

The data line 171 is connected to the switching source electrode 136b through the contact hole 62.

One end of the first data connecting member 174 is connected to the first storage electrode 155a through the contact hole 61, and the other end of the first data connecting member 174 is connected to the compensation drain electrode 137c and the initialization drain electrode 137d through the contact hole 63.

The second data connecting member 175 parallel to the data line 171 is connected to the initialization source electrode 136d through the contact hole 64.

The third data connecting member 179 is connected to the light emission control drain electrode 137f through the contact hole 66.

The passivation layer 180 is formed on the data wire (171, 172, 174, 175, and 179) and the second interlayer insulating layer 162. The passivation layer 180 is formed on substantially all of the display region and the non-display region.

The pixel electrode 191 and the initialization voltage line 192 are formed on the passivation layer 180. The third data connection member 179 is connected with the pixel electrode 191 through the contact hole 81 formed on the passivation layer 180. The second data connection member 175 is connected with the initialization voltage line 192 through the contact hole 82 formed on the passivation layer 180.

A pixel definition layer (PDL) 350 is formed to cover the passivation layer 180, the initialization voltage line 192, and the edge of the pixel electrode 191. The pixel definition layer 350 has a pixel opening 351 that exposes the pixel electrode 191.

The organic emission layer 370 is formed on the pixel electrode 191 exposed by the pixel opening 351, and the common electrode 270 is formed on the organic emission layer 370. The common electrode 270 is formed on the pixel definition layer 350 to be formed through the plurality of pixels. As such, an organic light emitting diode OLD is formed, which includes the pixel electrode 191, the organic emission layer 370, and the common electrode 270.

An encapsulation member protecting the organic light emitting diode OLD may be formed on the common electrode 270. The encapsulation member may be sealed to the substrate 110 by a sealant and may be formed of various materials such as glass, quartz, ceramic, plastic, or a metal. In a further exemplary embodiment of the inventive concept, a thin film encapsulation layer may be formed on the common electrode 270 by depositing the inorganic layer and the organic layer without the usage of the sealant.

While the inventive concept has been described in connection with reference to exemplary embodiments thereof, it will be understood that various changes in form and details may be made therein without departing from the spirit and scope of the appended claims.

What is claimed is:

1. A display device comprising:
   a substrate;
   a first metal wire positioned on the substrate and extending in a first direction;
   a gate insulating layer positioned on the first metal wire and the substrate;
   a second metal wire positioned on the gate insulating layer, extending in the first direction, and adjacent to the first metal wire;
   a first interlayer insulating layer positioned on the gate insulating layer and the second metal wire;
   a compensation pattern positioned on the first interlayer insulating layer and disposed between the first metal wire and the second metal wire; and
   a third metal wire and a fourth metal wire positioned on the first interlayer insulating layer and the compensation pattern,
   wherein the third metal wire and the fourth metal wire extend in a second direction,
   wherein the second direction is different from the first direction, and a groove disposed in the first interlayer insulating layer, and the compensation pattern is disposed at a lower surface of the groove.

2. The display device of claim 1, wherein the gate insulating layer and the first interlayer insulating layer are made of an inorganic insulating material.

3. The display device of claim 1, wherein the compensation pattern extends in the first direction.

4. The display device of claim 1, wherein the compensation pattern is made of a material having a different etching rate from the first interlayer insulating layer.

5. The display device of claim 4, wherein the compensation pattern is made of a metal.

6. The display device of claim 5, wherein the compensation pattern is made of the same material as the third metal wire and the fourth metal wire.

7. The display device of claim 1, wherein a thickness of the compensation pattern is thinner than the thickness of the third metal wire and the fourth metal wire.

8. The display device of claim 1, further comprising a second interlayer insulating layer positioned on the first interlayer insulating layer and the compensation pattern,
wherein the third metal wire and the fourth metal wire are positioned on the second interlayer insulating layer.

9. The display device of claim 8, wherein the thickness of the first interlayer insulating layer is thinner than the thickness of the second interlayer insulating layer.

10. The display device of claim 4, wherein the compensation pattern is made of a non-metal.

11. The display device of claim 1, wherein the third metal wire and the fourth metal wire are positioned directly on the compensation pattern and the first interlayer insulating layer.

12. The display device of claim 1, wherein the display device includes a display region and a non-display region positioned on the edge of the display region, and
the first metal wire, the second metal wire, the compensation pattern, the third metal wire, and the fourth metal wire are positioned in the non-display region.

13. The display device of claim 12, further comprising:
a first semiconductor positioned on the substrate;
a first gate electrode overlapping the first semiconductor; and
a storage electrode overlapping the first gate electrode,
wherein the first semiconductor, the first gate electrode, and the storage electrode are positioned in the display region,
the gate insulating layer is positioned between the first gate electrode and the storage electrode,
the first gate electrode is positioned in a same first layer as the first metal wire, and
the storage electrode is positioned in a same second layer as the second metal wire.

14. The display device of claim 13, further comprising:
a second semiconductor positioned on the substrate;
a second gate electrode positioned on the second semiconductor;
a data connecting member connected to the second semiconductor;
a pixel electrode connected to the data connecting member;
an organic emission layer positioned on the pixel electrode; and
a common electrode positioned on the organic emission layer,
wherein the second semiconductor, the second gate electrode, the data connecting member, the pixel electrode, the organic emission layer, and the common electrode are positioned in the display region,
the gate insulating layer and the first interlayer insulating layer are positioned between the second gate electrode and the data connecting member,
the second gate electrode is positioned in the same first layer as the first metal wire, and
the data connecting member is positioned in a same third layer as the third metal wire and the fourth metal wire.

15. A display device comprising:
a substrate;
a first metal wire positioned on the substrate and extending in a first direction;
a gate insulating layer positioned on the first metal wire and the substrate;
a second metal wire positioned on the gate insulating layer, extending in the first direction, and adjacent to the first metal wire;
a first interlayer insulating layer positioned on the gate insulating layer and the second metal wire;
a compensation pattern positioned on the first interlayer insulating layer and disposed between the first metal wire and the second metal wire; and
an entirety of a third metal wire and an entirety of a fourth metal wire positioned on the first interlayer insulating layer and extending in a second direction,
wherein the second direction is different from the first direction.

16. A display device of claim 15, further comprising a groove disposed in the first interlayer insulating layer,
wherein the compensation pattern is disposed at a lower surface of the groove.

* * * * *